(12) United States Patent
Cicalini

(10) Patent No.: US 8,779,810 B2
(45) Date of Patent: Jul. 15, 2014

(54) DYNAMIC DIVIDE BY 2 WITH 25% DUTY CYCLE OUTPUT WAVEFORMS

(75) Inventor: Alberto Cicalini, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 13/547,694

(22) Filed: Jul. 12, 2012

(65) Prior Publication Data

US 2013/0015891 A1  Jan. 17, 2013

Related U.S. Application Data

(60) Provisional application No. 61/508,531, filed on Jul. 15, 2011.

(51) Int. Cl.
*H03K 21/00* (2006.01)
*H03K 23/00* (2006.01)
*H03K 25/00* (2006.01)

(52) U.S. Cl.
USPC ............................. 327/115; 327/117; 327/118

(58) Field of Classification Search
USPC ......... 327/115, 116, 117, 118, 355–361, 202, 327/203, 208–212, 218; 377/47, 48; 455/4
See application file for complete search history.

(56) References Cited

U.S. PATENT DOCUMENTS

| | | | |
|---|---|---|---|
| 7,082,053 B1* | 7/2006 | Jenne et al. | 365/173 |
| 7,091,756 B2 | 8/2006 | Collier et al. | |
| 7,180,973 B2 | 2/2007 | Austin et al. | |
| 7,565,128 B2* | 7/2009 | Marie | 455/326 |
| 7,750,749 B2* | 7/2010 | Jones | 332/105 |
| 7,751,792 B2* | 7/2010 | Connell et al. | 455/323 |
| 7,839,187 B2 | 11/2010 | Lee et al. | |
| 8,050,649 B2* | 11/2011 | Chen et al. | 455/326 |
| 2003/0201800 A1* | 10/2003 | Matsuo et al. | 327/57 |
| 2006/0104123 A1* | 5/2006 | Razavi et al. | 365/189.05 |
| 2008/0191755 A1 | 8/2008 | Tsai | |
| 2009/0068975 A1* | 3/2009 | Luong et al. | 455/325 |
| 2011/0050296 A1 | 3/2011 | Fagg | |
| 2012/0098585 A1* | 4/2012 | Kitsunezuka et al. | 327/359 |
| 2012/0242378 A1* | 9/2012 | Taghivand et al. | 327/117 |

OTHER PUBLICATIONS

Allstot D J., et al., "An Image-Rejection Down-Converter for Low-IF Receivers", IEEE Transactions on Microwave Theory and Techniques, IEEE Service Center, Piscataway, NJ, US, vol. 53, No. 2, Feb. 1, 2005, pp. 478-487, XP011126907.

(Continued)

*Primary Examiner* — Brandon S Cole
(74) *Attorney, Agent, or Firm* — William M. Hooks

(57) ABSTRACT

Disclosed are frequency dividers, methods, apparatus, and other implementations, including a frequency divider that includes at least one input line to deliver at least one signal with a first frequency, a divider stage comprising multiple divider active components to produce output signals each with a second frequency equal to substantially half the first frequency, and an input stage electrically coupled to the divider stage to enable operation of the divider stage, the input stage including multiple additional active components. Each of the output signals is electrically coupled to an input of a different corresponding component of the multiple additional active components to electrically actuate the respective different corresponding components such that each of the multiple additional active components is periodically in an ON state while during the same time at least another of the multiple additional active components of the input stage is in an OFF state.

16 Claims, 5 Drawing Sheets

(56) References Cited

OTHER PUBLICATIONS

International Search Report and Written Opinion—PCT/US2012/046797—ISA/EPO—Jan. 2, 2013.

Krishna, M.V., "Design and Analysis of Ultra Low Power True Single Phase Clock CMOS 2/3 Prescaler," IEEE Transactions on Circuits and Systems-I: Regular Papers, vol. 57, No. 1, Jan. 2010, pp. 72-82.

* cited by examiner

DYNAMIC DIVIDE BY 2 WITH 25% DUTY CYCLE OUTPUT WAVEFORMS

CROSS-REFERENCE TO RELATED APPLICATION

This application claims the benefit of and priority to provisional U.S. application Ser. No. 61/508,531, entitled "DIVIDE BY 2 WITH NO STATIC CURRENT AND 25% DUTY CYCLE OUTPUT WAVEFORMS," and filed Jul. 15, 2011, the content of which is incorporated herein by reference in its entirety.

BACKGROUND

Frequency mixers (e.g., frequency dividers) with 25% duty cycles (e.g., implementing an I-Q quadrature generator) are often used for their good conversion loss as compared, for example, to frequency dividers with 50% duty cycle. Nevertheless, generating waveforms with good phase and gain accuracy, and with a 25% duty cycle, sometimes results in high power consumption.

SUMMARY

The proposed implementations of the present disclosure include a frequency divider circuit producing I-Q quadrature waveforms with a 25% duty cycle with relatively low current consumption.

In some variations, a frequency divider is disclosed. The frequency divider includes at least one input line to deliver at least one signal with a first frequency, a divider stage comprising multiple divider active components to produce output signals each with a second frequency equal to substantially half the first frequency, and an input stage electrically coupled to the divider stage to enable operation of the divider stage, the input stage including multiple additional active components, each of the additional multiple components electrically coupled to the at least one input line. Each of the output signals of the multiple divider active components is electrically coupled to an input of a different corresponding component of the multiple additional active components of the input stage to electrically actuate the respective different corresponding components of the multiple additional active components such that each of the multiple additional active components is periodically in an ON state while during the same time at least another of the multiple additional active components of the input stage is in an OFF state.

Embodiments of the frequency divider may include at least some of the features described in the present disclosure, including one or more of the following features.

The each of the output signals of the multiple divider active components may be electrically coupled to the input of the different corresponding component of the multiple additional active components of the input stage such that each of the multiple additional active components is periodically in an ON state while during the same time the at least other of the multiple additional active components of the input stage is not drawing power.

The output signals produced by the multiple divider active components may include four output signals each with the second frequency equal to substantially half the first frequency, and each of the four output signals being out of phase with respect to each other of the four output signals. The each of the four output signals may be at least 90° out of phase with respect to the each other of the four output signals.

The multiple additional active components of the input stage may include multiple groups of one or more MOSFET-based transistors. The multiple groups of one or more MOSFET-based transistors may include a first transistor group with a first output of the divider stage electrically coupled to a gate of at least one transistor of the first transistor group, a second transistor group with a second output of the divider stage electrically coupled to a gate of at least one transistor of the second transistor group, a third transistor group with a third output of the divider stage electrically coupled to a gate of at least one transistor of the third transistor group, and a fourth transistor group with a fourth output of the divider stage electrically coupled to a gate of at least one transistor of the fourth transistor group. The divider stage may include a first and second divider stage transistors electrically coupled to a first latch electrically coupled to the first and second outputs the divider stage, and a third and fourth divider stage transistors electrically coupled to a second latch electrically coupled to the third and fourth outputs.

The multiple divider active components may include one or more of, for example, an inverter gate, and/or a MOSFET-based transistor.

In some variations, a method is disclosed. The method includes controllably actuating multiple components of an input stage of a frequency divider, the input stage configured to enable operations of a divider stage of the frequency divider comprising multiple divider components, each of the multiple components of the input stage is coupled to at least one input delivering at least one signal with a first frequency. The method further includes providing output signals produced by the multiple divider components of the divider stage to inputs of the multiple components of the input stage to cause the controllably actuating of the multiple components of the input stage, each of the output signals including a second frequency equal to substantially half the first frequency. Each of the output signals produced by the multiple divider components is coupled to an input of a different corresponding component of the multiple components of the input stage to actuate the respective different corresponding component of multiple components of the input stage such that each of the multiple components of the input stage is periodically in an ON state with at least another of the multiple components of the input stage is in an OFF state at the same time.

Embodiments of the method may include at least some of the features described in the present disclosure, including at least some of the features described above in relation to the frequency divider, as well as one or more of the following features.

The multiple components of the input stage may include multiple groups of one or more transistors.

Providing output signals produced by the multiple divider components of the divider stage to inputs of the multiple components of the input stage to cause the controllably actuating of the multiple components of the input stage may include providing a first output of the divider stage to a first transistor group of the input stage, providing a second output of the divider stage to a second transistor group of the input stage, providing a third output of the divider stage to a third transistor group of the input stage, and providing a fourth output of the divider stage to a fourth transistor group of the input stage.

In some variations, an apparatus is disclosed. The apparatus includes means for controllably actuating multiple components of an input stage of a frequency divider, the input stage configured to enable operations of a divider stage of a frequency divider comprising multiple divider components, each of the multiple components of the input stage is coupled to at least one input line to deliver at least one signal with a first frequency, and means for providing output signals produced by the multiple divider components of the divider stage to inputs of the multiple components of the input stage to cause the controllably actuating of the multiple components of the input stage, each of the output signals including a second frequency equal to substantially half the first frequency. Each of the output signals produced by the multiple divider component is coupled to an input of a different corresponding component of the multiple components of the input stage to actuate the respective different corresponding component of multiple components of the input stage such that each of the multiple components of the input stage is periodically in an ON state with at least another of the multiple components of the input stage is in an OFF state at the same time.

Embodiments of the apparatus may include at least some of the features described in the present disclosure, including at least some of the features described above in relation to the frequency divider and the method.

In some variations, a frequency divider is disclosed. The frequency divider includes at least one input line to deliver at least one signal with a first frequency, a divider stage comprising multiple divider active components to produce output signals each with a second frequency equal to a fraction of the first frequency, and an input stage electrically coupled to the divider stage to enable operation of the divider stage, the input stage comprising multiple additional active components, each of the additional multiple components electrically coupled to the at least one input line. Each of the output signals of the multiple divider active components is electrically coupled to an input of a different corresponding component of the multiple additional active components of the input stage to electrically actuate the respective different corresponding components of the multiple additional active components such that each of the multiple additional active components is periodically in an ON state while during the same time at least another of the multiple additional active components of the input stage is in an OFF state.

Embodiments of the frequency divider may include at least some of the features described in the present disclosure, including at least some of the features described above in relation to the first frequency divider, the method, and the apparatus.

Unless defined otherwise, all technical and scientific terms used herein have the same meaning as commonly or conventionally understood. As used herein, the articles "a" and "an" refer to one or to more than one (i.e., to at least one) of the grammatical object of the article. By way of example, "an element" means one element or more than one element. "About" and/or "approximately" as used herein when referring to a measurable value such as an amount, a temporal duration, and the like, is meant to encompass variations of ±20% or ±10%, ±5%, or +0.1% from the specified value, as such variations are appropriate to in the context of the systems, devices, circuits, methods, and other implementations described herein. "Substantially" as used herein when referring to a measurable value such as an amount, a temporal duration, a physical attribute (such as frequency), and the like, is also meant to encompass variations of ±20% or ±10%, ±5%, or +0.1% from the specified value, as such variations are appropriate to in the context of the systems, devices, circuits, methods, and other implementations described herein.

As used herein, including in the claims, "and" as used in a list of items prefaced by "at least one of" or "one or more of" indicates that any combination of the listed items may be used. For example, a list of "at least one of A, B, and C" includes any of the combinations A or B or C or AB or AC or BC and/or ABC (i.e., A and B and C). Furthermore, to the extent more than one occurrence or use of the items A, B, or C is possible, multiple uses of A, B, and/or C may form part of the contemplated combinations. For example, a list of "at least one of A, B, and C" may also include AA, AAB, AAA, BB, etc.

Other and further objects, features, aspects, and advantages of the present disclosure will become better understood with the following detailed description of the accompanying drawings.

BRIEF DESCRIPTION OF THE DRAWINGS

Like reference symbols in the various drawings indicate like elements.

DETAILED DESCRIPTION

Disclosed herein are systems, devices, frequency dividers, methods, and other implementations, including a frequency divider that includes at least one input line to deliver at least one signal with a first frequency, a divider stage (also referred to as a divider section) comprising multiple divider active components to produce output signals each with a second frequency equal to substantially half the first frequency, and an input stage (also referred to as an input section) electrically coupled to the divider stage to enable operation of the divider stage, the input stage comprising multiple additional active components, with each of the additional multiple components electrically coupled to the at least one input line. Each of the output signals of the multiple divider active components is electrically coupled to an input of a different corresponding component of the multiple additional active components of the input stage to electrically actuate the respective different corresponding components of the multiple additional active components such that each of the multiple additional active components of the input stage is periodically in an ON state while during the same time at least another of the multiple additional active components of the input stage is in an OFF state.

Figure 1:
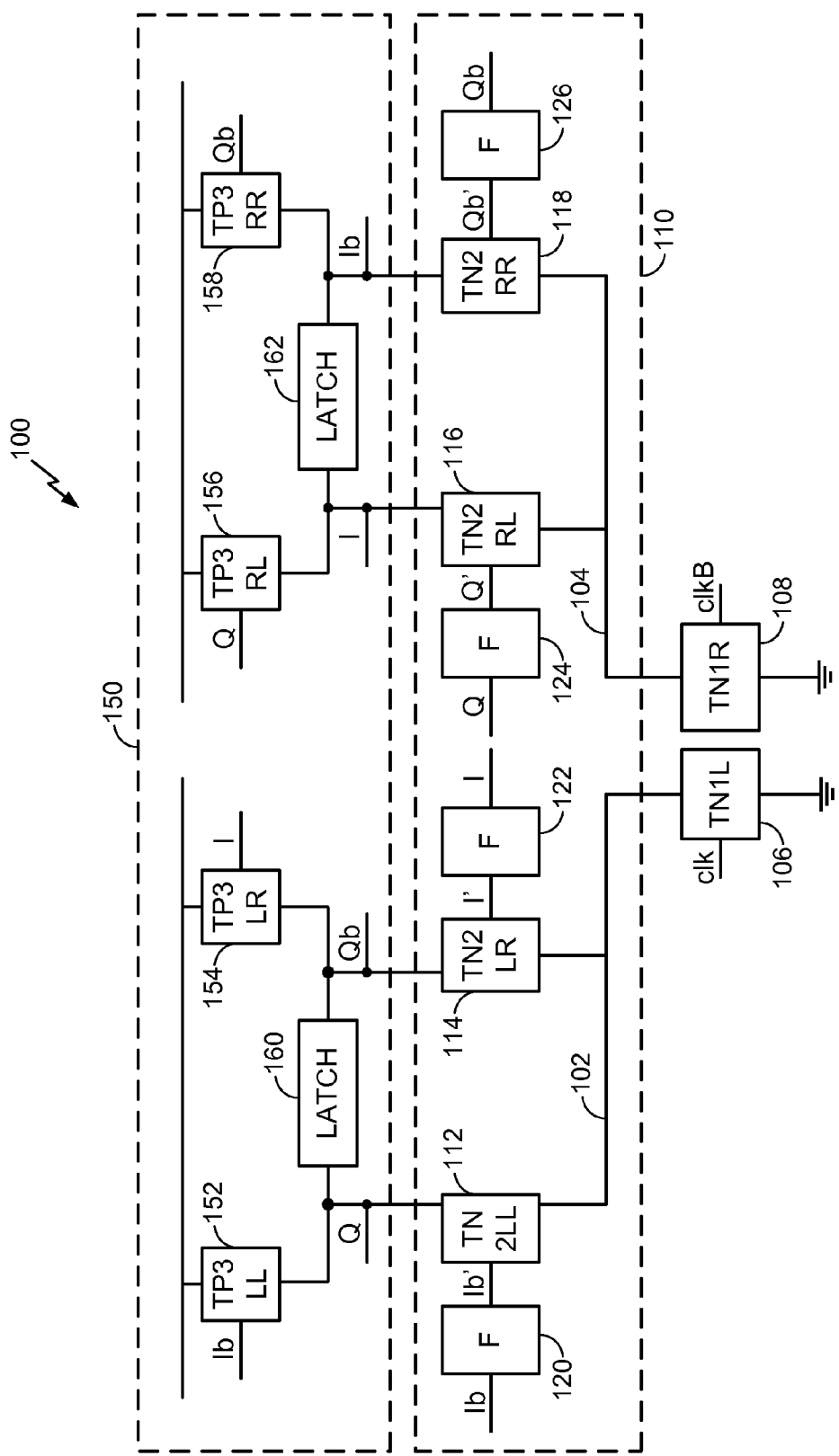
FIG. 1 is a schematic circuit diagram of an example frequency divider that implements a dynamic divide-by-2 with 25% duty cycle output waveforms.

With reference to FIG. 1, a schematic circuit diagram of an example frequency divider 100 that implements a dynamic divide-by-2 with 25% duty cycle output waveforms is shown. The divider 100 includes an input stage 110, coupled to a divider stage 150, to enable operation of the divider stage (which outputs the divide-by-2 output signals). The frequency divider 100 may be implemented, in some variations, using different types of switching devices (realized, for example, using active components such as transistors). The input stage 110 includes multiple active components that are each electrically coupled to either an input line 102 through which a signal to be divided (e.g., a clock, or "clk" signal), having a first frequency (e.g., ω), is delivered, or to an input line (such as an input line 104) carrying, for example, a conjugate (reciprocal) signal of the signal on the input line 102 (in the example of FIG. 1, line 104 carries the signal "clkB," also referred to as clk-bar). As will be described in greater details below, through controlled actuation of the multiple active components of the input stage, those active components can be turned ON or OFF to thus facilitate controlling the generation of the divider's outputs. By periodically causing components (e.g., transistors) of the input stage into their OFF states, power consumption of the frequency divider 100 can be reduced. In the example of FIG. 1, the input stage 110 includes four (4) N-type transistors (e.g., N-MOSFET transistors), namely, a transistor 112 (denoted as TN2 LL, where "2" refers to transistors of the second stage of the circuit, which is the input stage, and where "LL" indicates the transistor's position in the diagram as left transistor of the left side of the input stage 110), a transistor 114 (denoted TN2 LR), a transistor 116 (denoted TN2 RL), and a transistor 118 (denoted TN2 RR). The N-type transistors used in the implementations of the input stage 110 are configured to cause the transistor to be turned ON when the N-type transistor is actuated by a HIGH signal, e.g., by applying a HIGH (or logical 1) actuation signal to the transistor's actuation terminal, which for a MOSFET transistor is its Gate terminal.

As further shown in FIG. 1, in some variations, incoming actuation signals to controllably actuate the input stage's multiple active components may be coupled to delay elements coupled to the actuation terminals of the active components. The delay elements enable achieving better alignment/synchronization between the various signals of the frequency divider 100. For example, delay elements may be used to delay the propagation of at least some of the generated output signals upon transition of the states of the input signals clk and clkB so that the active components of the input stage do not change their states (from ON to OFF, or vice versa) prematurely before at least some of the output signals have been generated. In the example of FIG. 1, delay elements 120, 122, 24, and 126 (all of which are depicted using the box marked "F") receive the actuation signals (which are the outputs of the divider circuit) and output a delayed version of the actuation signals that are provided to the multiple active components of the input stage 110. In the event that more delay is desired, additional delay elements may be used, or, alternatively, components configured to cause a longer delay may be used.

The multiple active components of the input stage 110 are coupled to the divider stage 150 of the frequency divider 100 (the configuration of the divider stage depicted in FIG. 1 is sometimes referred to a Razavi divider configuration). The divider stage may be implemented, in some variations, using switching devices, such as switching device realized using active components, e.g., various transistors. In the implementations of FIG. 1, the active components of the divider stage 150 may include P-channel transistors that can be actuated to be in their ON state (e.g., to be conductive) in response to LOW (logical 0) actuation signals applied to their actuation terminals (e.g., a LOW signal applied to the gates of P-MOSFET-type transistors). As shown in FIG. 1, the divider stage 150 includes four (4) P-type transistors (e.g., P-MOSFET transistors), namely, a transistor 152 (denoted as TP3 LL, where "3" refers to transistors of the third stage, which is the divider stage in the implementation of FIG. 1, and "LL" indicates the transistor's position in the diagram as left transistor of the left side of the divider stage 150), a transistor 154 (denoted TP3 LR), a transistor 156 (denoted TP3 RL), and a transistor 158 (denoted TP3 RR). The divider stage further includes two latches 160 and 162 which may each be implemented as cross-coupled transistors, e.g., each latch may include two cross-coupled MOSFET transistors, in some variations.

As further depicted in FIG. 1, there are four (4) outputs associated with the divider stage. Particularly, they include an output Q, which is coupled to the transistor 152 and to the latch 160, an output Qb (Q-bar) coupled to the transistor 154 and to the latch 160, an output I coupled to the transistor 156 and to the latch 162, and an output Ib (I-bar) coupled to the transistor 158 and to the latch 162. As will be described in greater details below, operation of the frequency divider 100 results in each of the outputs associated with the divider stage 150 having substantially half the frequency (e.g., ω/2) of the incoming clock signals (clk and/or clkB) having the first frequency ω, and being at least one clock cycle out-of-phase with respect to each other, e.g., one output will become HIGH one clock cycle after a preceding output has gone HIGH.

As noted, the outputs produced by the divider stage 150 are coupled to the actuation terminals of the multiple active components comprising the input stage 110 to cause each of the active components of the input stage to be periodically in an ON state and periodically in an OFF state. Each of the outputs of the divider stage is coupled to a different one of the multiple active components of the input stage. For example, in the implementations of FIG. 1, the output Q is coupled to the actuation terminal (e.g., gate of an N-MOSFET transistor) of the transistor 116 (via the delay element 124 in the example of FIG. 1, although in some embodiments no delay or more delay may be realized), the output Qb is coupled to the actuation terminal of the transistor 118 (via the delay element 126 in the example of FIG. 1), the output I is coupled to the actuation terminal of the transistor 114 (via the delay element 122 in the example of FIG. 1), and the output Ib is coupled to the actuation terminal of the transistor 112 (via the delay element 120 in the example of FIG. 1).

Because the outputs of the divider stage are periodic signals (with a frequency substantially half the frequency of the input signals clk or clkB) that are out of phase with respect to each other, when these outputs actuate the multiple active components of the input stage, at least one of the active components will be in an OFF state because its actuating signal (i.e., one of the outputs of the divider stage) will be LOW. Thus, in the implementations of FIG. 1, by causing at least one of the components of the input stage 110 to be in an OFF state, and therefore to not conduct, that at least one active component will not be drawing power when actuated by a LOW signal from one of the outputs of the divider stage. By coupling each of the outputs of the divider stage 150 to different ones of the multiple active components of the input stage, in some implementations, each of the active components of the input stage may be periodically in an ON state (and possibly drawing power) while at least one of the other active components of the input stage is not drawing power. In some implementations, each of the active components of the input stage may be periodically in an ON state, while all the other active components of the input stage are not drawing power during the time that one of the active components is ON.

The frequency divider 100 also include two switching devices, namely transistors 106 (denoted as TN1L, where "1" refers to transistors of the first stage of the frequency divider, and "L" indicates the transistor's position in the diagram as a left transistor in the first stage), and transistors 108 (denoted TN1R). These two transistors are actuated by the clk and clkB signals and are thus alternatingly in their ON and OFF states.

When one of the transistors 106 and 108 is in its ON state, an electrical path between the ground and the respective transistors of the input stage to which that transistor is coupled is established.

Figure 2:
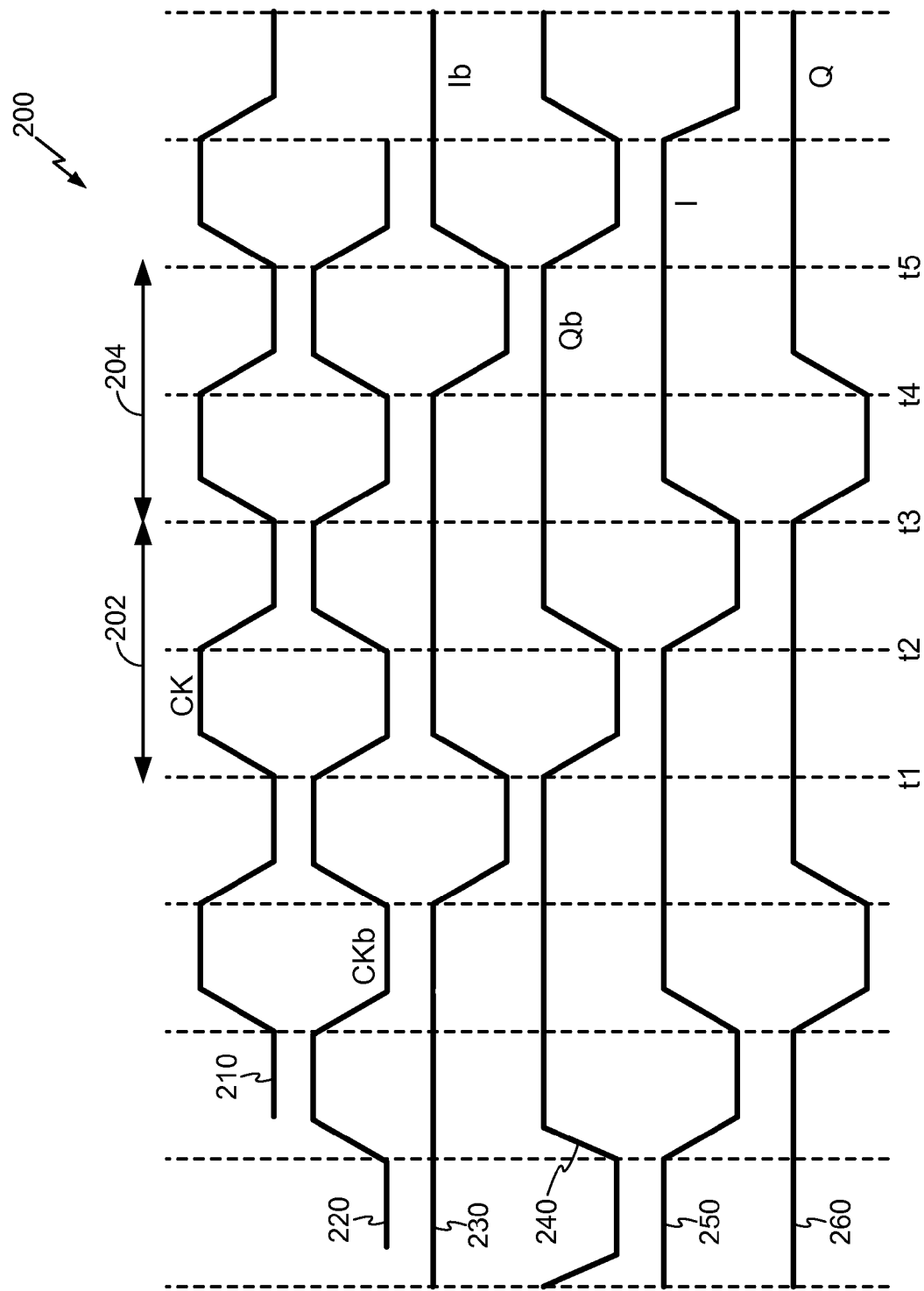
FIG. 2 is a graph with timing diagrams of the various signals (input and output) of the frequency divider of FIG. 1.

Operation of the example implementations of the frequency divider of FIG. 1 will now be described with further reference to FIG. 2 showing a graph 200 with timing diagrams of the various signals of the frequency divider 100. Particularly, FIG. 2 illustrates a timing diagram 210 showing the behavior of the signal CK (corresponding to clk), a timing diagram 220 showing the behavior of the signal CKb (corresponding to clkB), a timing diagram 230 showing the behavior of the signal Ib, a timing diagram 240 showing the behavior of the signal Qb, a timing diagram 250 showing the behavior of the signal I, and a timing diagram 260 showing the behavior of the signal Q. The timing diagrams illustrate the behavior of the frequency divider 100 of FIG. 1 over four (4) clock cycles, which correspond to one complete cyclical period of producing the I-Q quadrature outputs of the frequency divider.

Description of the operation of the frequency divider 100 will begin at a time just before t1 on the graph 200. At that time, the signal clk is LOW, but is about to go HIGH (i.e., t1 is the time corresponding to the beginning of the rising edge of the clock signal clk, as shown in the diagram 210), and the signal clkB is HIGH, but is about to go LOW. Additionally, at time t1, the output signal Q is 1 (i.e., is HIGH), the output signal Qb is also 1, the output signal I is 1, and the output signal Ib is 0 (i.e., LOW).

At time t1, the signal clk (CK) goes HIGH, and the transistor 106, coupled to the input clk signal, is set to its ON state. At that time the transistor 152, which is actuated by Ib=0 is in its ON state (P-type transistors used in the implementations of FIG. 1 are in their ON state when their actuating signals are LOW). The N-type transistor 114 of the input stage 110, which is actuated by I=1, will also be in its ON state. However, at t1, the P-type transistor 154 which is also actuated by I=1 will be OFF, and the N-type transistor 112, which is actuated by Ib=0, will be OFF as well. Consequently, because the transistor 152 is ON, and the transistor 112 is OFF, the voltage level at the point corresponding to the output Q of the divider stage 150 will be at a logical 1. On the other hand, because the transistor 154 is OFF, and the transistors 114 and 106 are both ON (and are thus conducting), the voltage level at the point on the circuit corresponding to Qb will be a logical 0 (because the voltage drop from the available voltage of the voltage source driving the circuit will be substantially entirely on the transistor 152).

Because Q=1, and Qb=0 immediately after the time t1, the P-type transistor 156, which is actuated by Q=1, will be in an OFF state, as will the N-type transistor 118 which is actuated by Qb=0. On the other hand, the P-type transistor 158, which is actuated by Qb=0, will be ON, as will the N-type transistor 116 actuated by Q=1. Because the transistor 158 is ON, and the transistor 118 is OFF (as is the transistor 108), the voltage level at the point on the circuit corresponding to Ib will a logical 1. On the other hand, because both the transistors 156 and 108 are in their OFF states, the voltage level at the point on the circuit corresponding to I retains its previous value (which was a logical 1). As a result, both Ib and I are set to 1.

At t2, the signal clk (CK) goes LOW while the signal clkB (CKb) goes HIGH. Consequently, the transistor 108 is set to an ON state and becomes conductive, thus coupling the ground to the transistors 116 and 118, while the transistor 106 is set to its OFF state. Because the transistor 116 is ON (and thus conductive) and is coupled to the ground via the transistor 108, and the transistor 156 is OFF, the output I becomes 0.

On the other hand, the transistor 118 (which is still actuated by Qb=0) is still in its OFF stage, while the transistor 158 is in its ON state, and therefore Ib remains at a level of a logical 1.

Because I is now 0, and Ib is 1, the transistors 154 and 112 are set to their ON states (and are thus conducting), while the transistors 152 and 114 are set to their OFF states. As a result, both Q and Qb are set to 1 (e.g., because the transistor 106 and the transistor 152 are both OFF, Q just maintains whatever value it previously had through operation of the latch 160, whereas because the transistor 154 is ON while the transistors 114 and 106 are off, the voltage level at the point corresponding to Qb will be at a logical 1).

On the next clock cycle, namely at time t3, the signal clk (CK) goes HIGH (logical 1) again, and as a result the transistor 106 is set to its ON state (and conducts) thus coupling the ground to the transistors 112 and 114, while clkB (CKb) goes LOW, thus creating an open circuit between the ground and the transistors 116 and 118. Because at this point the transistor 112 is in its ON state, and is therefore coupled to the now conducting transistor 106, but the transistor 152 is in its OFF state, the voltage level at the point corresponding to the output Q is set to a logical 0 (i.e., Q becomes 0). Qb is still 1 at this point because the transistor 154 is still its ON state, whereas the transistor 114 is still in its OFF state.

Because Q=0, and Qb=1, the P-type transistor 156, which is now actuated by Q=0, is set to its ON state, while the P-type transistor 158 which is actuated by Qb=1 is its OFF state. The N-type transistor 116 which is also actuated by Q=0 will be in its OFF state, while the N-type transistor 118 which is actuated by Qb=1 is in its ON state. Because the transistor 156 is ON while the transistors 116 and 108 are OFF, the voltage level at the point corresponding to the output I will be a logical 1. Additionally, because the transistors 158 and 108 are both in their OFF states, the voltage level at the point corresponding to the output Ib will remain at a logical 1 level.

On the next clock cycle, namely at time t4, the signal clk (CK) goes LOW again (logical 0), and as a result the transistor 106 is set to its OFF state. The signal clkB (CKb), on the other hand, goes to a logical 1 level (HIGH), thus coupling the ground to the transistors 116 and 118. Because at this point the transistor 118 is in its ON state, and is therefore coupled to the now conducting transistor 106, the voltage level at the point corresponding to the output Ib is set to a logical 0 (i.e., Ib becomes 0). I is still at a level of 1 because the transistor 156 is still its ON state, whereas the transistor 116 is still in its OFF state.

Because I=1, and Ib=0, the P-type transistor 152, which is now actuated by Ib=0, is set to its ON state, while the P-type transistor 154, which is actuated by I=1, is in its OFF state. The N-type transistor 114, which is also actuated by I=1, will be in its ON state, while the N-type transistor 112, which is actuated by Ib=0, is in its OFF state. Because the transistor 152 is ON while the transistors 112 and 106 are OFF, the voltage level at the point corresponding to the output Q will be at a logical 1 level. On the other hand, because the transistors 154 and 106 are both in their OFF states, the voltage level at the point corresponding to the output Qb will retain its previous state and will remain at a level of a logical 1.

Thus, after t4, Q and Qb are both 1, I is 1, and Ib is 0, and the process of producing the next sequence of I-Q quadrature outputs, in a manner similar to that that took place between t1-t4, starts anew.

As illustrated in the timing diagrams of FIG. 2, each of the cycles of the outputs I, Ib, Q, and Qb has a period that is substantially twice the period of either of the clk or clkB signals, and thus each of these outputs has a frequency which is substantially half that of the frequency of clk or clkB. For example, between the times t1 to t5 indicated in the graph 200, the clk signal (marked as CK) completes two cycles (marked as cycles 202 and 204). During that same time period, the output signal Ib completes just a single period. Specifically, Ib goes HIGH at t1, goes LOW at t4, and then goes HIGH again at t5. In the example implementations of FIG. 1, the frequency divider generates a rotating "0" (i.e., at any given clock cycle, only one output of the divider stage 150 is at a logical 0). In some variations, the frequency divider 100 may be implemented so that the divider stage 150 produces a rotating "1." For example, in some variations, inverters may be used to invert the outputs of the divider (the non-inverted output may still be used to actuate the inputs of the active components of the input stage 110). In some variations a frequency divider may be realized to produce a rotating "1" by implementing the complementary version of the circuit shown in FIG. 1.

Although FIGS. 1 and 2 depict the implementation and operation of a divide-by-2 frequency divider, other frequency dividers, e.g., to produce signals constituting other fractions (e.g., ⅓, ¼, ⅛, etc.) of the clk signal's frequency, may be realized through appropriate circuit configurations.

Figure 3:
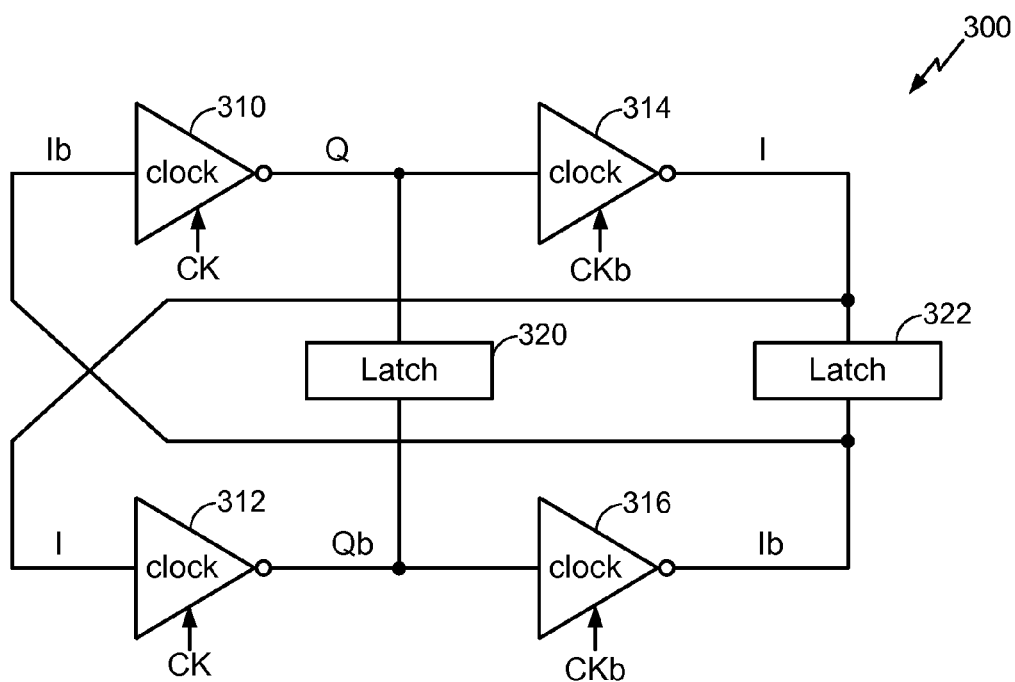
FIG. 3 is a schematic circuit diagram of an example frequency divider implemented with inverter components.

In some variations, a frequency divider to implement dynamic divide-by-2 operations with a 25% duty cycle may be realized using other types of active components. For example, FIG. 3 is a schematic diagram of another frequency divider 300. As depicted, the frequency divider 300 is implemented using four (4) clocked inverter gates 310, 312, 314, and 316. In some embodiments, the inverter gates 310, 312, 314, and 316 may be realized using transistors, such as MOSFET transistors. In the example divider 300 of FIG. 3, two of the inverters, namely, inverters 310 and 312 are clocked using the signal CK, with the signal CK having a frequency ω that is to be divided so as to generate a resultant signal(s) with substantially half that frequency (i.e., ω/2). The inverters 310 and 312 will therefore be active (and will be inverting their respective inputs Ib, and I) during the active phase of the CK signal to produce their output signals Q and Qb, respectively. On the other hand, the inverters 314 and 316 are clocked using the signal CKb (CK-bar), and will therefore be active (and will invert their respective inputs Q and Qb) during the active phase of the CKb signal to produce their outputs I and Ib, respectively. As further illustrated in FIG. 3, the frequency divider 300 also includes a latch 320 that is electrically coupled to points on the divider 300 corresponding to the outputs of the inverters 310 and 312, and a latch 322 that is electrically coupled to points on the divider 300 corresponding to the divider's outputs of the inverters 314 and 316. The latches 320 and 322 may also be implemented, in some embodiments, using discrete transistors.

Figure 4:
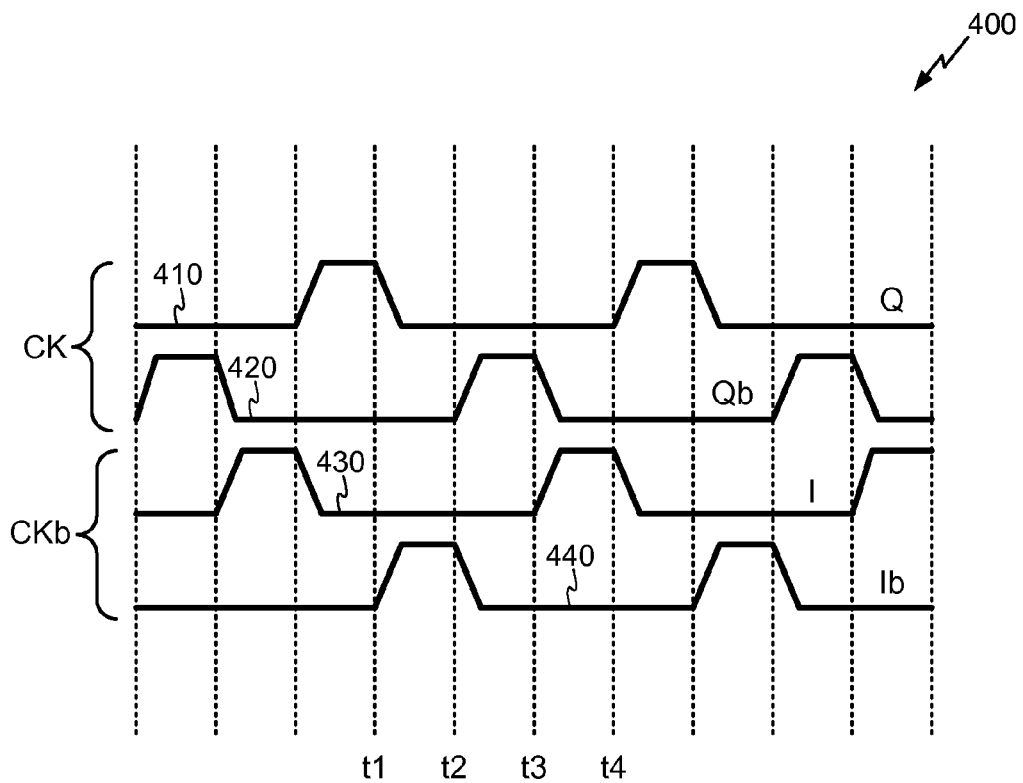
FIG. 4 is a graph with timing diagrams of various output signals of the frequency divider of FIG. 3.

Operation of the example implementations of the frequency divider of FIG. 3 will now be described with further reference to FIG. 4 showing a graph 400 with timing diagrams of the various output signals of the frequency divider 300. Particularly, FIG. 4 illustrates a timing diagram 410 showing the behavior of the signal Q, a timing diagram 420 showing the behavior of the signal Qb, a timing diagram 430 showing the behavior of the signal I, and a timing diagram 440 showing the behavior of the signal Ib. The timing diagrams illustrate the behavior of the frequency divider 300 of FIG. 3 over several clock cycles during which the I-Q quadrature outputs of the frequency divider 300 are alternately produced.

Description of the operation of the divider 300 begins at the time t1 indicated in FIG. 4. At that point, the output Q is 1, Qb is 0, I is 0, and Ib is 0. When the clock signal CKb is asserted (i.e., it goes HIGH), and conversely CK goes low, the inverters 314 and 316 are activated, and consequently they invert their respective outputs. Accordingly, the input to the inverter 314, namely, Q, which at t1 is at a level corresponding to a logical 1, is inverted by the inverter 314 to produce the output I=0. The inverter 316 inverts its input, namely, Qb, which is 0 at t1, to produce the output Ib=1. The output Qb of the inactive inverter 312 remains at 0, while the output Q of the inactive inverter 310 becomes 0.

At t2, CKb become LOW, and CK goes HIGH, thus causing the inverters 310 and 312 to become active, and consequently to invert their respective inputs. Accordingly, the inverter 310 inverts the input Ib=1 to produce the output Q=0, and the inverter 312 inverts its input I=0, to produce the output Qb=1. The output I of the now inactive inverter 314 (because CKb is LOW) remains 0, while the output Ib of the inactive inverter 316 becomes 0.

At t3, CK goes LOW and CKb goes HIGH again, thus causing the inverters 314 and 316 to become active and to invert their respective inputs. Thus, the inverter 314 inverts its input Q=0 to produce the output I=1, while the inverter 316 inverts its input Qb=1 to produce the output Ib=0. The output Q of the now inactive inverter 310 (because CK is LOW) remains 0, while the output Qb of the inactive inverter 312 becomes 0.

Lastly, at t4 CKb becomes LOW again, and CK goes HIGH, thus causing the inverters 310 and 312 to once again become active, and consequently to invert their respective inputs. Accordingly, the inverter 310 inverts the input Ib=0 to produce the output Q=1, and the inverter 312 inverts its input I=1, to produce the output Qb=0. The output Ib of the now inactive inverter 316 remains 0, while the output I of the inactive inverter 314 becomes 0.

Other frequency divider configurations in which outputs of a frequency divider are electrically coupled to components of an input stage to controllably actuate those components may be implemented to produce output signals each with a frequency equal to substantially half (or some other fraction or multiple) the frequency of the input signal feeding into the divider, and each of the output signals being out of phase with respect to any one of the other output signals, i.e., no signal is in phase with any of the other output signals. In some variations, each output is at least 90° (e.g., 1 input clk/clkB signal cycle) out of phase with respect to any other of the output signals.

Figure 5:
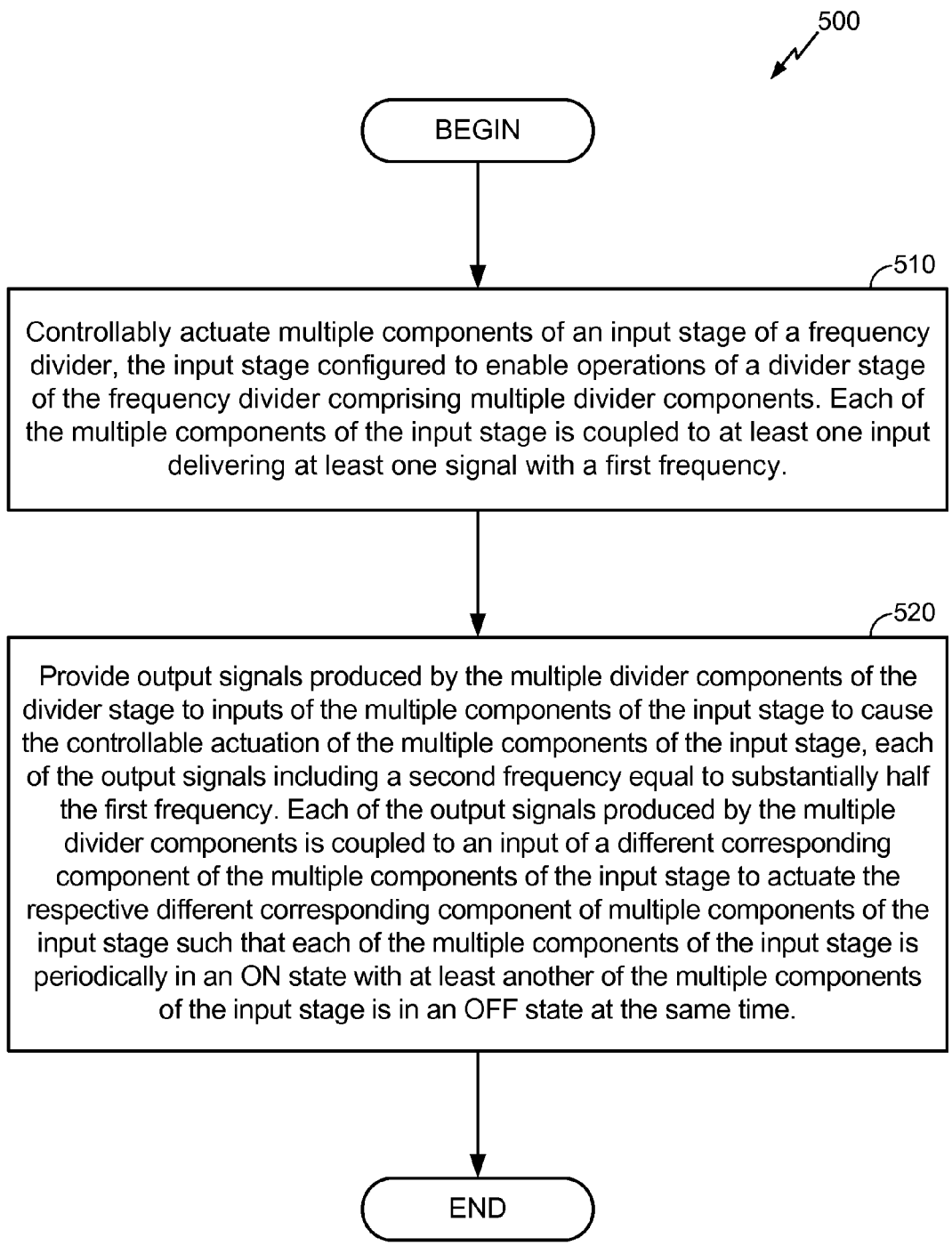
FIG. 5 is a flowchart of an example procedure for performing frequency division operations.

With reference now to FIG. 5, a flowchart of an example procedure 500 for performing frequency division operations is shown. The procedure 500 includes controllably actuating 510 multiple components of an input stage of a frequency divider, the input stage configured to enable operations of a divider stage of the frequency divider comprising multiple divider components. Each of the multiple components of the input stage is coupled to at least one input delivering at least one signal with a first frequency.

The output signals produced by the multiple divider components of the divider stage are provided 520 to inputs of the multiple components of the input stage to cause the controllable actuation of the multiple components of the input stage. Each of the output signals includes a second frequency equal to substantially half the first frequency, and each of the output signals produced by the multiple divider components is coupled to an input of a different corresponding component of the multiple components of the input stage to actuate the respective different corresponding component of multiple components of the input stage such that each of the multiple components of the input stage is periodically in an ON state with at least another of the multiple components of the input stage is in an OFF state at the same time.

In some variations, a processor-based device(s) may be used to facilitate the implementation of at least some of the procedures, processes, and/or operations described herein. Such a processor-based device(s) may be coupled to a storage device that may include a computer program product that when executed on the processor-based device(s) causes the processor-based device to perform operations to facilitate the implementation of the above-described procedures/processes/operations.

Figure 6:
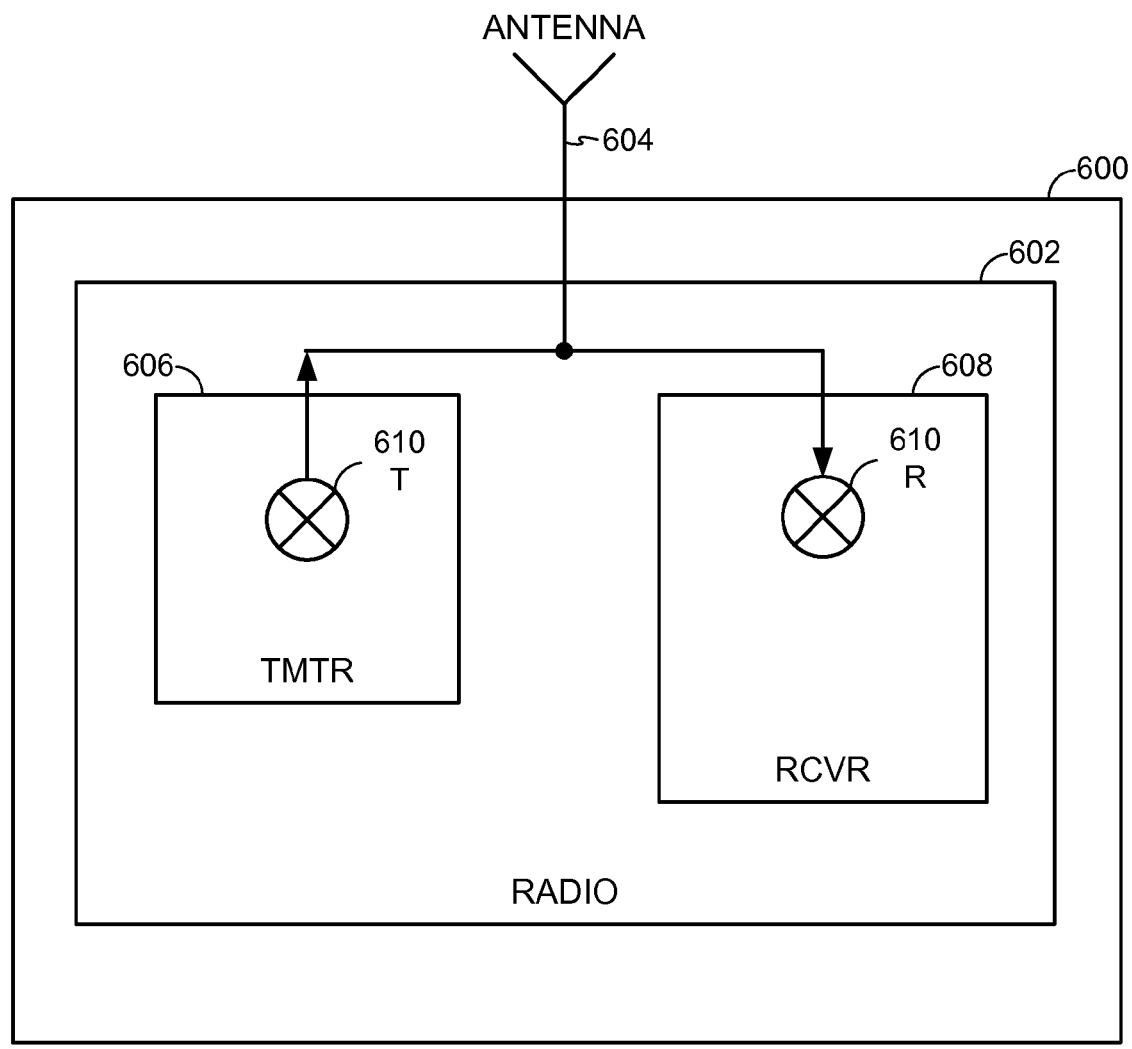
FIG. 6 is a schematic diagram of a radio system in which example frequency dividers may be used.

Referring now to FIG. 6, a radio system 600 is illustrated in which examples of the dividers described herein may be used. The radio system 600 may be a mobile cellular telephone, for example. The radio system 600 includes a radio frequency RF circuit 602 coupled to an antenna 604. The RF circuit 602 may include one or both of an RF transmitter 606 and an RF receiver 608 coupled to the antenna 604. One or more of the dividers described herein may be used, for example, in implementation of an up-converter 610T in the RF transmitter 606. One or more of the dividers described herein may be used, for example, in implementations of a down-converter 610R in the RF receiver 608.

Although particular embodiments have been disclosed herein in detail, this has been done by way of example for purposes of illustration only, and is not intended to be limiting with respect to the scope of the appended claims, which follow. In particular, it is contemplated that various substitutions, alterations, and modifications may be made without departing from the spirit and scope of the invention as defined by the claims. Other aspects, advantages, and modifications are considered to be within the scope of the following claims. The claims presented are representative of the embodiments and features disclosed herein. Other unclaimed embodiments and features are also contemplated. Accordingly, other embodiments are within the scope of the following claims.

What is claimed is:

1. A frequency divider comprising:
   at least one input line to deliver at least one signal with a first frequency;
   a divider stage comprising multiple divider active components to produce output signals each with a second frequency equal to substantially half the first frequency, wherein the divider includes a latch for retaining an immediately prior signal; and
   an input stage electrically coupled to the divider stage to enable operation of the divider stage, the input stage comprising multiple additional active components, each of the additional multiple components electrically coupled to the at least one input line, wherein the input stage includes at least one delay element for active clock devices;
   wherein each of the output signals of the multiple divider active components is electrically coupled to an input of a different corresponding component of the multiple additional active components of the input stage to electrically actuate the respective different corresponding components of the multiple additional active components such that each of the multiple additional active components is periodically in an ON state while during the same time at least another of the multiple additional active components of the input stage is in an OFF state.

2. The frequency divider of claim 1, wherein the each of the output signals of the multiple divider active components is electrically coupled to the input of the different corresponding component of the multiple additional active components of the input stage such that each of the multiple additional active components is periodically in an ON state while during the same time the at least other of the multiple additional active components of the input stage is not drawing power.

3. The frequency divider of claim 1, wherein the output signals produced by the multiple divider active components include four output signals each with the second frequency equal to substantially half the first frequency, and each of the four output signals being out of phase with respect to each other of the four output signals.

4. The frequency divider of claim 3, wherein the each of the four output signals is at least 90° out of phase with respect to the each other of the four output signals.

5. The frequency divider of claim 1, wherein the multiple additional active components of the input stage include multiple groups of one or more MOSFET-based transistors.

6. The frequency divider of claim 5, wherein the multiple groups of one or more MOSFET-based transistors include:
   a first transistor group with a first output of the divider stage electrically coupled to a gate of at least one transistor of the first transistor group;
   a second transistor group with a second output of the divider stage electrically coupled to a gate of at least one transistor of the second transistor group;
   a third transistor group with a third output of the divider stage electrically coupled to a gate of at least one transistor of the third transistor group; and
   a fourth transistor group with a fourth output of the divider stage electrically coupled to a gate of at least one transistor of the fourth transistor group.

7. The frequency divider of claim 6, wherein the divider stage comprises a first and second divider stage transistors electrically coupled to a first latch electrically coupled to the first and second outputs the divider stage, and a third and fourth divider stage transistors electrically coupled to a second latch electrically coupled to the third and fourth outputs.

8. The frequency divider of claim 1, wherein the multiple divider active components include one or more of: an inverter gate, and a MOSFET-based transistor.

9. A method comprising:
   controllably actuating multiple components of an input stage of a frequency divider, the input stage configured to enable operations of a divider stage of the frequency divider comprising multiple divider components, each of the multiple components of the input stage being coupled to at least one input delivering at least one signal with a first frequency, wherein the divider includes a latch for retaining an immediately prior signal and the input stage includes at least one delay element for active clock devices; and
   providing output signals produced by the multiple divider components of the divider stage to inputs of the multiple components of the input stage to cause the controllably actuating of the multiple components of the input stage, each of the output signals including a second frequency equal to substantially half the first frequency;
   wherein each of the output signals produced by the multiple divider components is coupled to an input of a different corresponding component of the multiple components of the input stage to actuate the respective different corresponding component of multiple components of the input stage such that each of the multiple components of the input stage is periodically in an ON state with at least another of the multiple components of the input stage is in an OFF state at the same time.

10. The method of claim 9, wherein the multiple components of the input stage include multiple groups of one or more transistors.

11. The method of claim 9, wherein providing output signals produced by the multiple divider components of the divider stage to inputs of the multiple components of the input stage to cause the controllably actuating of the multiple components of the input stage comprises:
   providing a first output of the divider stage to a first transistor group of the input stage;
   providing a second output of the divider stage to a second transistor group of the input stage;
   providing a third output of the divider stage to a third transistor group of the input stage; and
   providing a fourth output of the divider stage to a fourth transistor group of the input stage.

12. The method of claim 11, wherein the divider stage comprises a first and second divider stage transistors electrically coupled to a first latch electrically coupled to the first and second outputs the divider stage, and a third and fourth divider stage transistors electrically coupled to a second latch electrically coupled to the third and fourth outputs.

13. The method of claim 9, wherein the output signals produced by the multiple divider components include four output signals each with the second frequency equal to substantially half the first frequency, and each of the four output signals being out of phase with respect to each other of the four output signals.

14. The method of claim 9, wherein the each of the four signals is at least 90° out of phase with respect to the each other of the four output signals.

15. An apparatus comprising:
   means for controllably actuating multiple components of an input stage of a frequency divider, the input stage configured to enable operations of a divider stage of a frequency divider comprising multiple divider components, each of the multiple components of the input stage being coupled to at least one input line to deliver at least one signal with a first frequency, wherein the divider includes a latch for retaining an immediately prior signal and the input stage includes at least one delay element for active clock devices; and
   means for providing output signals produced by the multiple divider components of the divider stage to inputs of the multiple components of the input stage to cause the controllably actuating of the multiple components of the input stage, each of the output signals including a second frequency equal to substantially half the first frequency;
   wherein each of the output signals produced by the multiple divider component is coupled to an input of a different corresponding component of the multiple components of the input stage to actuate the respective different corresponding component of multiple components of the input stage such that each of the multiple components of the input stage is periodically in an ON state with at least another of the multiple components of the input stage is in an OFF state at the same time.

16. A frequency divider comprising:
   at least one input line to deliver at least one signal with a first frequency;
   a divider stage comprising multiple divider active components to produce output signals each with a second frequency equal to a fraction of the first frequency, wherein the divider includes a latch for retaining an immediately prior signal; and
   an input stage electrically coupled to the divider stage to enable operation of the divider stage, the input stage comprising multiple additional active components, each of the additional multiple components electrically coupled to the at least one input line, wherein the input stage includes at least one delay element for active clock devices;
   wherein each of the output signals of the multiple divider active components is electrically coupled to an input of a different corresponding component of the multiple additional active components of the input stage to electrically actuate the respective different corresponding components of the multiple additional active components such that each of the multiple additional active components is periodically in an ON state while during the same time at least another of the multiple additional active components of the input stage is in an OFF state.

* * * * *